(12) United States Patent
Wang et al.

(10) Patent No.: US 12,308,296 B2
(45) Date of Patent: May 20, 2025

(54) ELECTRONIC DEVICE AND MANUFACTURING METHOD THEREOF

(71) Applicant: InnoLux Corporation, Miao-Li County (TW)

(72) Inventors: Cheng-Chi Wang, Miao-Li County (TW); Kuang-Ming Fan, Miao-Li County (TW); Liang-Lu Chen, Miao-Li County (TW); Chia-Lin Yang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 699 days.

(21) Appl. No.: 17/528,167

(22) Filed: Nov. 16, 2021

(65) Prior Publication Data
US 2023/0043187 A1    Feb. 9, 2023

(30) Foreign Application Priority Data

Aug. 5, 2021   (CN) .......................... 202110896569.0

(51) Int. Cl.
*H01L 21/66*   (2006.01)
*H01L 23/00*   (2006.01)

(52) U.S. Cl.
CPC .............. *H01L 22/22* (2013.01); *H01L 24/19* (2013.01); *H01L 24/20* (2013.01); *H01L 2224/214* (2013.01)

(58) Field of Classification Search
CPC ......... H01L 22/22; H01L 24/19; H01L 24/20; H01L 2224/214
See application file for complete search history.

(56) References Cited

U.S. PATENT DOCUMENTS

| 8,071,168 | B2 | 12/2011 | Cruchon-Dupeyrat | |
| 8,274,104 | B2 * | 9/2012 | Lu .......................... | H01L 27/124 257/443 |
| 2005/0174505 | A1 * | 8/2005 | Lai ..................... | G02F 1/136259 349/54 |
| 2011/0169139 | A1 * | 7/2011 | Lin ....................... | H01L 23/481 257/621 |
| 2022/0246792 | A1 * | 8/2022 | Liao .................... | H01L 33/0095 |

FOREIGN PATENT DOCUMENTS

TW     201209947 A1    3/2012

* cited by examiner

*Primary Examiner* — Fernando L Toledo
*Assistant Examiner* — Neil R Prasad
(74) *Attorney, Agent, or Firm* — Winston Hsu (57) ABSTRACT

The present disclosure provides an electronic device and a manufacturing method thereof. The electronic device includes a connecting element. The connecting element includes a first conductive line segment, a second conductive line segment, and a first connecting line segment. The first conductive line segment is electrically connected to the second conductive line segment through the first connecting line segment. In a vertical projection direction, the first connecting line segment has a first height, the first conductive line segment has a second height, and the first height is different from the second height.

10 Claims, 6 Drawing Sheets

ELECTRONIC DEVICE AND MANUFACTURING METHOD THEREOF

BACKGROUND OF THE DISCLOSURE

1. Field of the Disclosure

The present disclosure relates to an electronic device and a manufacturing method thereof, and more particularly to an electronic device and a manufacturing method thereof that uses a conductive element to improve reliability of circuit.

2. Description of the Prior Art

Recently, with electronic devices have become smaller and smaller and more components need to be integrated into the electronic devices, the design and quality of metal traces between the components will affect the reliability of the electronic devices, especially the electrical property of the electronic device. In order to further increase circuit density and reduce costs, new packaging technologies such as fan out panel level package (FOPLP) and fan out wafer level package (FOWLP) have been introduced. However, how to improve the metal trace quality of the circuit is an issue that needs further improvement.

SUMMARY OF THE DISCLOSURE

An embodiment of the disclosure provides an electronic device, which includes a connecting element, and the connecting element includes a first conductive line segment, a second conductive line segment, and a first connecting line segment. The first conductive line segment is electrically connected to the second conductive line segment through the first connecting line segment. In a vertical projection direction, the first connecting line segment has a first height, the first conductive line segment has a second height, and the first height is different from the second height.

An embodiment of the present disclosure provides a manufacturing method of an electronic device including the following steps. A substrate and a connecting element are provided, where the connecting element is disposed on the substrate. The connecting element is detected to obtain an opening, where the connecting element includes a first conductive line segment and a second conductive line segment, and the opening is located between the first conductive line segment and the second conductive line segment. A conductive element is provided corresponding to the opening. The conductive element is cured to form a first connecting line segment. An uncured portion of the conductive element is removed. A laser trimming process is performed on the first connecting line segment, where the first conductive line segment is electrically connected to the second conductive line segment through the first connecting line segment.

These and other objectives of the present disclosure will no doubt become obvious to those of ordinary skill in the art after reading the following detailed description of the embodiment that is illustrated in the various figures and drawings.

DETAILED DESCRIPTION

The contents of the present disclosure will be described in detail with reference to specific embodiments and drawings. It is noted that, for purposes of illustrative clarity and being easily understood by the readers, the following drawings may be simplified schematic diagrams of electronic devices or a portion of the electronic devices, and components therein may not be drawn to scale. The numbers and dimensions of the components in the drawings are just illustrative, and are not intended to limit the scope of the present disclosure.

Certain terms are used throughout the specification and the appended claims of the present disclosure to refer to specific components. Those skilled in the art should understand that electronic equipment manufacturers may refer to a component by different names, and this document does not intend to distinguish between components that differ in name but not function. In the following description and claims, the terms "comprise", "include" and "have" are used in an open-ended fashion, so they should be interpreted as "including but not limited to . . . ".

It should be understood that when a component or layer is referred to as being "on" or "disposed on" another component or layer, or "connected to" another component or layer, it may be directly on the another component or layer or directly connected to the another component or layer, or there may be an interposed component or layer between the two components or layers (indirect case). Conversely, when a component is referred to as being "directly on" another component or layer, "directly disposed on" another component or layer, or "directly connected to" another component or layer, there are no interposed components or layers between the two components or layers. In addition, the arrangement relationship between different components may be explained by the content of the drawings.

An electrical connection may be a direct connection or an indirect connection. When two elements are electrically connected, the electrical signals may be transmitted by direct contact, and there are no other elements presented between the two elements. When two elements are electrically connected, the electrical signals may be transmitted through the intermediate element bridging the two elements. The electrical connection may also be referred to as coupling.

In addition, it should be understood that although the terms "first", "second", "third", etc. may be used herein to describe various components, these components should not be limited by these terms. These terms may be used to distinguish different components. The same terms may not be used in the claims, and the components in the claims may be described by the terms "first", "second", "third", etc. according to the order of the components presented in the claims. Thus, a first component discussed below may be termed as a second component in the claims without departing from the present disclosure.

According to the embodiments of the present disclosure, the width, thickness, height or area of each component, or the distance or spacing between components may be measured by using an optical microscopy (OM), a scanning electron microscope (SEM), a film thickness profile measuring instrument (α-step), an ellipsometer, or other suitable methods. In detail, according to some embodiments, a scanning electron microscope may be used to obtain a cross-sectional structure image containing the components to be measured, and to measure the width, thickness, height or area of each component, or the distance or spacing between the components, and to obtain the volume of the component through appropriate methods (such as integration).

Here, the terms "about", "equal to", "equal" or "the same", "substantially" or "approximately" usually mean within 20% of a given value, or within 10%, 5%, 3%, 2%, 1% or 0.5% of the given value.

It should be understood that according to the following embodiments, features of different embodiments may be replaced, recombined or mixed to constitute other embodiments without departing from the spirit of the present disclosure.

The electronic devices of the present disclosure may include, for example, a package component, a display device, an antenna device, a touch display device, a curved display device, or a non-rectangular display device (free shaped display device), but not limited thereto. The electronic devices may be bendable or flexible electronic devices. The electronic devices may include, for example, a light-emitting diode (LED), liquid crystal, fluorescence, phosphor, other suitable display medium, or a combination thereof, but not limited thereto. The light-emitting diode may include, for example, an organic light-emitting diode (OLED), an inorganic light-emitting diode (LED), a mini light emitting diode (mini-LED), a micro light emitting diode (micro-LED) or quantum dots (QDs) light emitting diode (such as QLED, QDLED), other suitable materials, or any combination thereof, but not limited thereto. The display devices may include, for example, a tiled display device, but not limited thereto. The concept or principle of the present disclosure may also be applied to non-self-luminous liquid crystal display (LCD), but not limited thereto.

The antenna device may include, for example, a liquid crystal antenna, or other kinds of antenna, but not limited thereto. It should be noted that the electronic devices of the present disclosure may be any combination of the aforementioned devices, but not limited thereto. In addition, the appearance of the electronic devices may be rectangular, circular, polygonal, a shape with curved edges, or other suitable shapes. The electronic devices may have peripheral systems such as a driving system, a control system, a light source system, a shelf system, etc., to support a display device, an antenna device or a tiled device. The following electronic devices take a display device as an example, but not limited thereto.

A direction X, a direction Y and a direction Z are shown in the following drawings. An electronic device 10 of the present disclosure may include a connecting element 102.

For example, the electronic device 10 of the present disclosure may for example be a package component, and the connecting element 102 may for example be a redistribution layer (RDL) in the package component, but not limited thereto. The connecting element 102 may include a plurality of dielectric layers and a plurality of metal layers. In a schematic cross-sectional view (for example, FIG. 3 of the present disclosure), the connecting element 102 may be formed of dielectric layers and conductive layers stacked alternately one by one along the direction Z.

The direction Z may be the stacking direction of the dielectric layers and the metal layers of the connecting element 102 in the electronic device 10, but not limited thereto. The direction X and the direction Y may be, for example, the extending direction of the dielectric layer, but not limited thereto. The direction Z may be perpendicular to the direction X and the direction Y, and the direction X may be perpendicular to the direction Y. The direction Z may also be referred to as a vertical projection direction or a top-view direction. The spatial relationship of the structure may be described according to the direction X, the direction Y and the direction Z in the following drawings.

Figure 1:
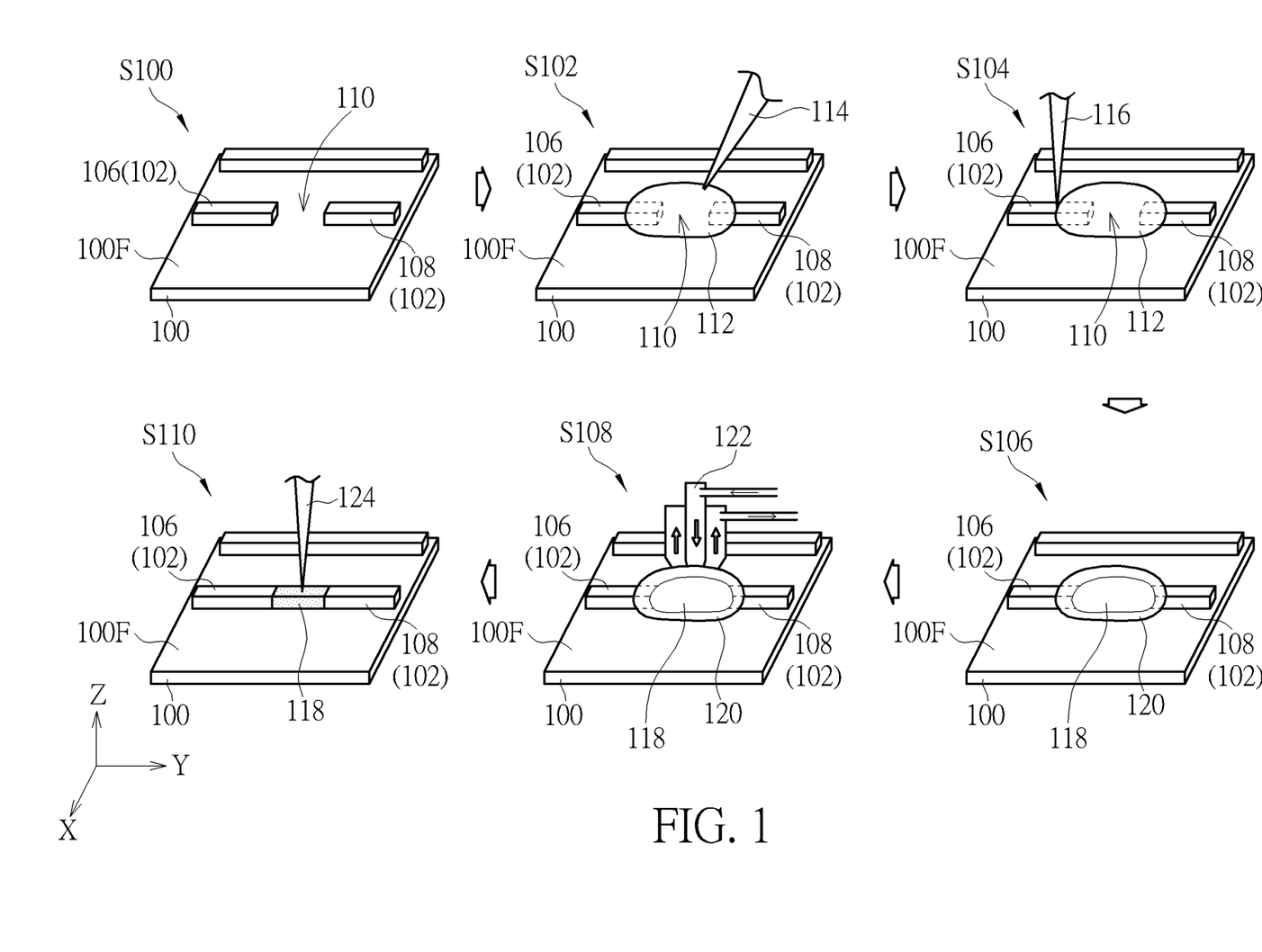
FIG. 1 is a schematic diagram of a manufacturing method of an electronic device according to a first embodiment of the present disclosure.
Figure 8:
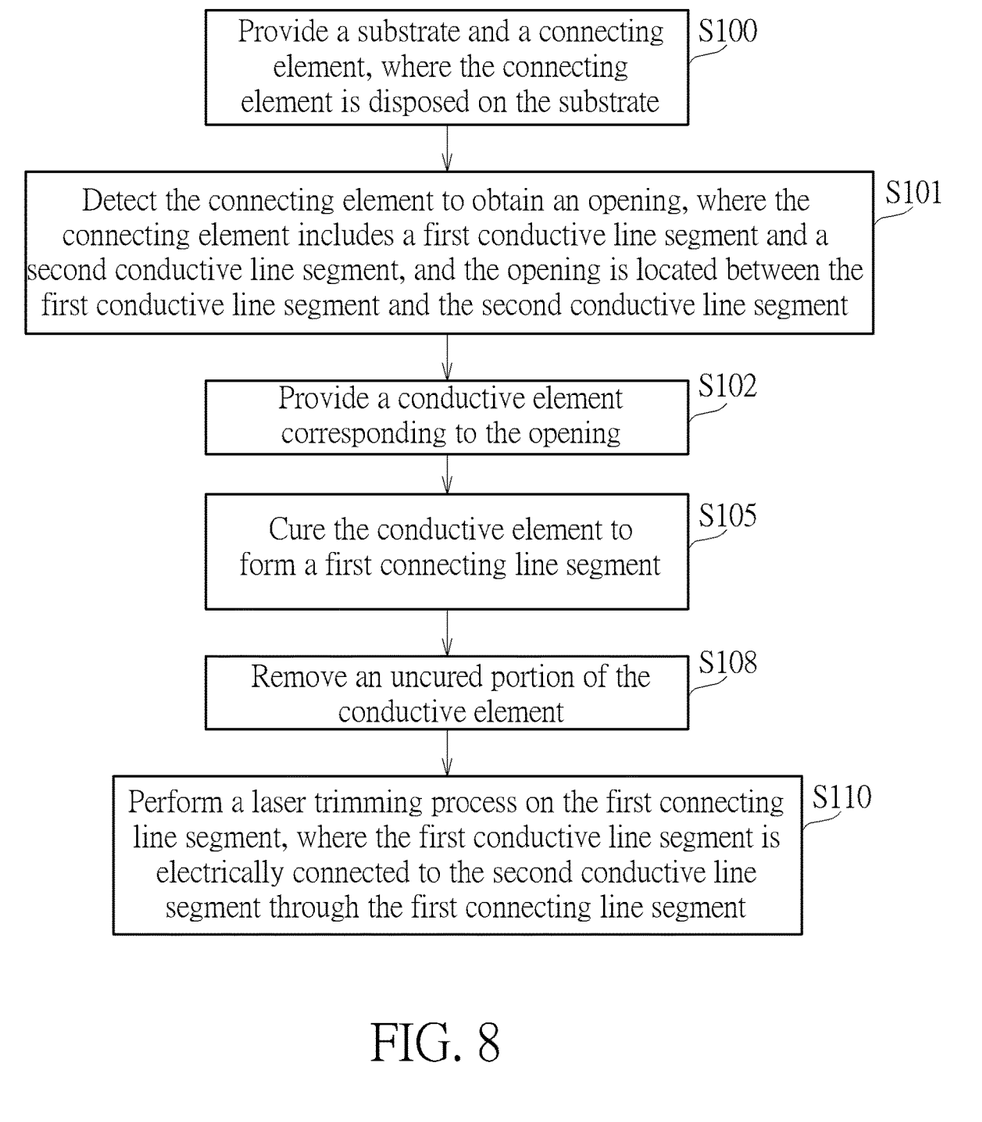
FIG. 8 is a flow chart of steps of a manufacturing method of an electronic device of the present disclosure.

Please refer to FIG. 1 and FIG. 8, FIG. 1 is a schematic diagram of a manufacturing method of an electronic device according to a first embodiment of the present disclosure, and FIG. 8 is a flowchart of steps of a manufacturing method of an electronic device of the present disclosure. In order to clearly show the technical features of the present disclosure and make the drawings easier to understand, FIG. 1 only illustrates a substrate and one of the conductive layers in the connecting element. However, the connecting element may also include other dielectric layers or conductive layers, and other electronic components may also be disposed on the substrate. As shown in FIG. 1 and FIG. 8, firstly, a step S100 may be performed to provide a substrate 100 and a connecting element 102, where the connecting element 102 is disposed on the substrate 100. The material of the substrate 100 may include wafer, glass, quartz, sapphire, molding compounds (such as resin, epoxy), polymers (such as polyimide (PI), polyethylene terephthalate (PET)) and/or other suitable materials to be used as a flexible substrate or a rigid substrate, but not limited thereto.

In some embodiments, the substrate 100 may be a temporary substrate. For example, the substrate 100 may be used as a supporting substrate during the manufacturing or repairing processes of the electronic device or the connecting element 102, and removed after the electronic device or the connecting element 102 is completed, so that the substrate 100 may not be present in the final product. However, in some embodiments, the substrate 100 may not be removed and may be present in the final product.

Figure 3:
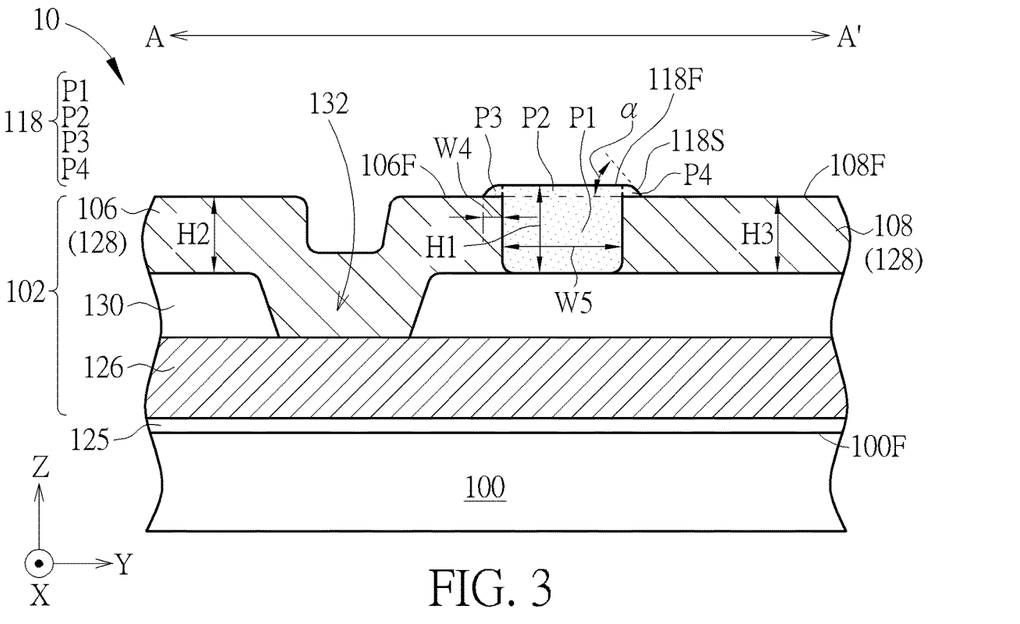
FIG. 3 is a schematic cross-sectional view of the electronic device according to the first embodiment of the present disclosure.

As shown in FIG. 1, one of the conductive layers in the connecting element 102 may include a conductive layer 128 of FIG. 3. The material of the conductive layer in the connection element 102 may include copper or other suitable metal materials. The conductive layer in the connecting element 102 may be formed by, for example, an electroplating process, but not limited thereto. As shown in FIG. 1, one of the conductive layers in the connecting element 102 (such as the conductive layer 128 of FIG. 3) may include a discontinuous wire. The discontinuous wire may cause an open-circuit condition of the electronic device, that is, the conductive layer may include a broken wire, where the broken wire may include a conductive line segment 106 (or may be referred to as a first conductive line segment) and a conductive line segment 108 (or may be referred to as a second conductive line segment), and an opening 110 may be located between the conductive line segment 106 and the conductive line segment 108.

Therefore, as shown in FIG. 8, the manufacturing method of the electronic device may include performing a step S101 to detect the connecting element 102 to obtain the opening 110 (or may be referred to as a broken position or an open position), where the connecting element 102 includes the conductive line segment 106 and the conductive line segment 108, and the opening 110 is located between the conductive line segment 106 and the conductive line segment 108. The detection method may include automated optical inspection (AOI), but not limited thereto.

Then, as shown in FIG. 1 and FIG. 8, a step S102 may be performed to provide a conductive element 112 corresponding to the opening 110. The conductive element 112 may include conductive glue, metal ink or other suitable conductive materials, but not limited thereto. For example, the material of the conductive element may include copper or other suitable metal materials. For example, the conductive element 112 may be a conductive ink containing metallic copper, which is applied to the opening 110 through an inkjet process, but not limited thereto. As shown in FIG. 1, a nozzle 114 may be used to apply the conductive element 112 to the opening 110 in the inkjet process, but not limited thereto.

Next, as shown in FIG. 1, a step S104 may be performed to cure the conductive element 112 using a laser 116. For example, the curing method may include thermal curing, but not limited thereto. The method of thermal curing is not limited to the use of lasers, and ultraviolet light may also be used. Then, as shown in FIG. 1, a step S106 may be performed, and the cured conductive element 112 may include a connecting line segment 118 (or may be referred to as a first connecting line segment) and an uncured portion 120, but not limited thereto. The size (such as the line width) of the connecting line segment 118 in this stage may be greater than the size of the conductive line segment 106 or the conductive line segment 108. The aforementioned step S104 and step S106 of FIG. 1 may correspond to a step S105 in FIG. 8.

Then, as shown in FIG. 1 and FIG. 8, a step S108 may be performed to remove the uncured portion 120 of the conductive element 112. As shown in FIG. 1, a cleaning module 122 may be used to remove the uncured portion 120 of the conductive element 112, but not limited thereto. For example, the cleaning module 122 may use water or other suitable solvents to remove the uncured portion 120 of the conductive element 112, but not limited thereto.

Next, as shown in FIG. 1 and FIG. 8, a step S110 may be performed to perform a laser trimming process on the connecting line segment 118. As shown in the step S108 of FIG. 1, the size (such as the line width) of the connecting line segment 118 formed after curing may be greater than the size of the conductive line segment 106 or the conductive line segment 108, and the excessive difference in size may cause an excessive difference in the resistance of the wire. Therefore, a laser 124 may be used to trim the size of the connecting line segment 118. For example, the line width of the conductive line segment 106 or the conductive line segment 108 may be about two micrometers, and the line width of the connecting line segment 118 formed after curing may be greater than two micrometers. Therefore, the laser 124 may be used to trim the line width of the connecting line segment 118 to about two micrometers. In addition, the laser 124 and the laser 116 may have different energies, or the laser 124 and the laser 116 may use different types of lasers.

Therefore, the conductive line segment 106 may be electrically connected to the conductive line segment 108 through the connecting line segment 118 by the manufacturing method of this embodiment. In addition, the step S100 to the step S110 in FIG. 1 may be regarded as one cycle, and the height (or the thickness) of the cured metal portion formed by the conductive element 112 in each cycle may be about 0.4 micrometers, so multiple cycles may be repeated to make the height of the connecting line segment 118 to reach the designed specification to ensure that the electrical performances of the electronic device can meet the product specification.

Other steps may be performed before or after any step, or between two steps shown in the manufacturing method of the electronic device in FIG. 1 or FIG. 8. In addition, certain steps may be performed in a different order. Through the manufacturing method of the embodiments of the present disclosure, the reliability of the product may be improved. For example, the manufacturing method of the electronic device of the present disclosure may be, for example, a repair method, which may repair defective products or solve the open-circuit problem, thereby improving the yield of products, but not limited thereto.

In some embodiments, the manufacturing method of this embodiment may be used in package components. For example, it may be used to repair the open-circuit problem caused by particles, substrate warp or other fan-out panel-level packaging process. In some embodiments, the manufacturing method of this embodiment may be used to repair the open-circuit problem caused by chip alignment in the fan-out panel-level packaging process. Alternatively, in some embodiments, the manufacturing method of this embodiment may be used to repair the open-circuit problem caused by incomplete removal of metal oxides (such as copper oxide) in the contact holes.

Figure 2:
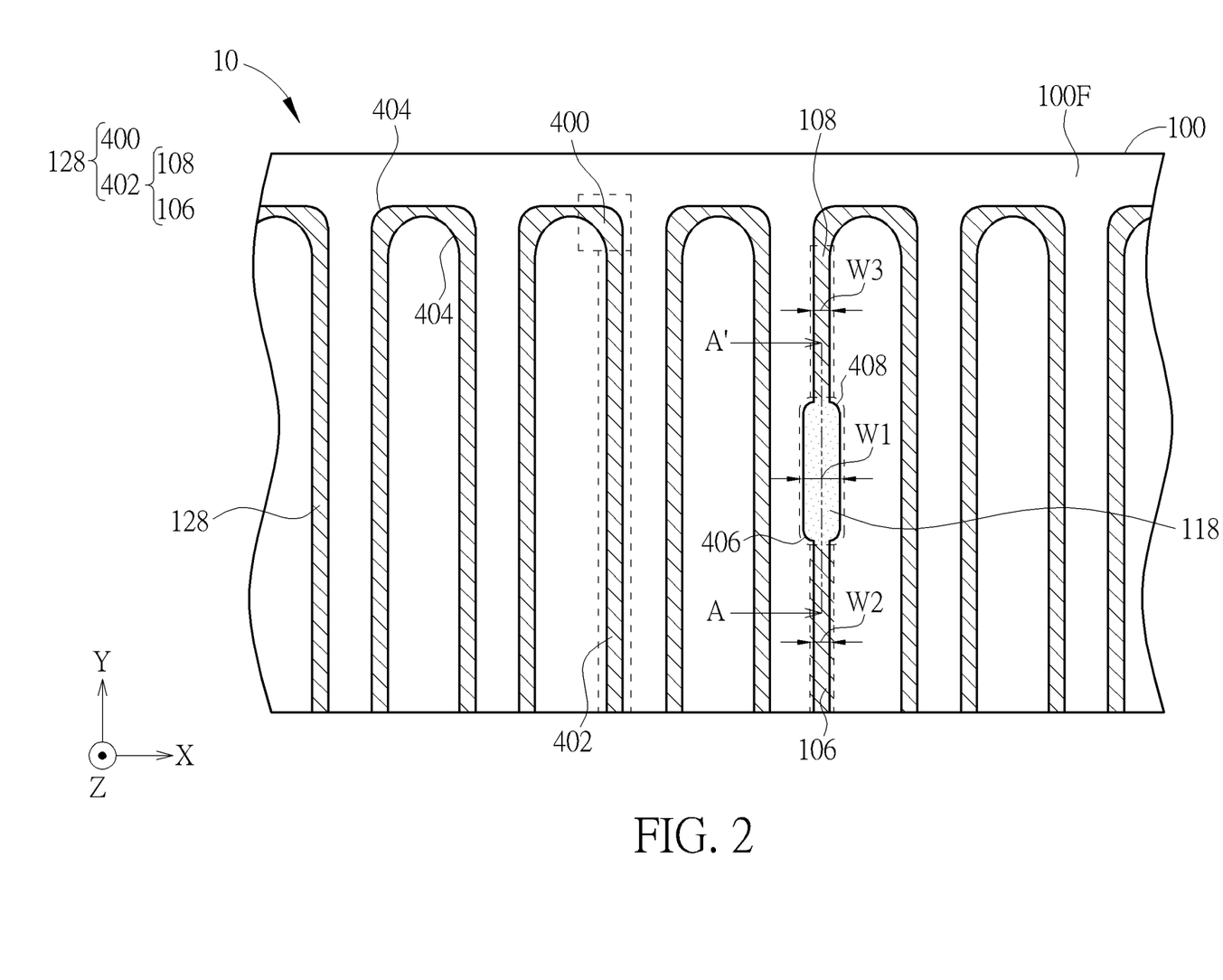
FIG. 2 is a schematic top view of one of conductive layers in a connecting element of the first embodiment of the present disclosure.

Please refer to FIG. 2 and FIG. 3, FIG. 2 is a schematic top view of one of the conductive layers in a connecting element of the first embodiment of the present disclosure, and FIG. 3 is a schematic cross-sectional view of the electronic device of the first embodiment of the present disclosure, where the cross-sectional structure of FIG. 3 may correspond to the cross-sectional line A-A' in FIG. 2. In order to clearly show the technical features of the present disclosure and make the drawings easier to understand, FIG. 2 depicts the substrate 100 and one of the conductive layers in the connecting element 102. FIG. 3 depicts the substrate 100 and two of the conductive layers and one of the dielectric layers in the connecting element 102. However, the number of dielectric layers or conductive layers in the connecting element 102 is not limited thereto, and other electronic components may also be disposed on the substrate 100.

In detail, the electronic component of the electronic device may be electrically connected to other electronic components of the electronic device through the connecting element 102, or the electronic component of the electronic device may be electrically connected to other electronic devices through the connecting element 102, but not limited thereto. The electronic component may be, for example, a resistor, a capacitor, an inductor, a chip, a combination thereof, or other suitable electronic components, but not limited thereto.

FIG. 2 is an example of a top view of an electronic device 10. The electronic device 10 may include a substrate 100 and a connecting element 102, and the connecting element 102 is disposed on the substrate 100. The conductive layer 128 of FIG. 2 may be, for example, one of the metal layers in the connecting element 102, but not limited thereto. The pattern of the conductive layer 128 may have, for example, a plurality of bent conductive line segments 400 and a plurality of straight conductive line segments 402, and the bent conductive line segment 400 and the straight conductive line segment 402 are connected to each other. The bent conductive line segment 400 of the conductive layer 128 may have an arc-shaped edge 404, and this design may reduce the fracture of the conductive layer 128 caused by bending, but not limited thereto. In addition, the straight conductive line segments 402 have substantially the same extension direction, for example, extending in the direction Y or extending in the direction X, and the bent conductive line segment 400 may be, for example, a portion of the conductive layer 128 that is changed in the substantial extension direction.

In the conductive layer 128, the connecting line segment 118 may be disposed between the conductive line segment 106 and the conductive line segment 108, and the connecting line segment 118 may be directly connected to the conductive line segment 106 and the conductive line segment 108, so that the conductive line segment 106 is electrically connected to the conductive line segment 108 through the connecting line segment 118. The conductive line segment 106 and the conductive line segment 108 may be, for example, a portion of the straight conductive line segment 402, but not limited thereto. One end of the connecting line segment 118 is electrically connected to the conductive line segment 106, and a connection of the connecting line segment 118 connecting to the conductive line segment 106 has an arc-shaped edge 406, or another end of the connecting line segment 118 is electrically connected to the conductive line segment 108, and a connection of the connecting line segment point 118 connecting to the conductive line segment 108 has an arc-shaped edge 408, and this design may reduce charge accumulation. In some embodiments, the bent conductive line segment 400 may include the opening 110, and may be repaired through the conductive element 112, but not limited thereto.

As shown in FIG. 2, in the direction X, a width W1 of the connecting line segment 118 may be greater than a width W2 of the conductive line segment 106 or a width W3 of the conductive line segment 108, and the width W2 of the conductive line segment 106 may be substantially the same as the width W3 of the conductive line segment 108, but not limited thereto.

FIG. 3 is another example of the electronic device 10. In this example, a release layer 125 may be disposed between the connecting element 102 and the substrate 100. The release layer 125 may include a light release material or a thermal release material, but not limited thereto. In addition, in this example, the connecting element 102 may include a conductive layer 126, a conductive layer 128, and a dielectric layer 130. The dielectric layer 130 may be disposed between the conductive layer 126 and the conductive layer 128, but not limited thereto. The conductive layer 128 may include the conductive line segment 106 and the conductive line segment 108, but not limited thereto. The dielectric layer 130 may include at least one opening 132, and the conductive layer 128 (such as the conductive line segment 106) may be electrically connected to the conductive layer 126 through the opening 132, but not limited thereto. The material of the dielectric layer in the connecting element 102 may include organic or inorganic insulating materials, but not limited thereto.

As shown in FIG. 3, the connecting line segment 118 may include a portion P1 (or may be referred to as a first portion), a portion P2 (or may be referred to as a second portion), a portion P3 (or may be referred to as a third portion), and a portion P4 (or may be referred to as a fourth portion). The portion P2 may be disposed on the portion P1, that is, the portion P2 may cover the portion P1, and the portion P1 may be disposed between the conductive line segment 106 and the conductive line segment 108. The portion P3 may partially cover a surface 106F of the conductive line segment 106, and the portion P4 may partially cover a surface 108F of the conductive line segment 108. The portion P2 may be disposed between the portion P3 and the portion P4, that is, the portion P2 may connect the portion P3 and the portion P4.

The second portion P2 of the connecting line segment 118 may have a surface 118F, and the surface roughness of the surface 118F of the connecting line segment 118 may be different from the surface roughness of the surface 106F of the conductive line segment 106, or the surface roughness of the surface 118F of the connecting line segment 118 may be different from the surface roughness of the surface 108F of the conductive line segment 108. For example, the surface roughness of the surface 106F of the conductive line segment 106 or the surface roughness of the surface 108F of the conductive line segment 108 may be greater than the surface roughness of the surface 118F of the connection line segment 118. For example, through this design, the adhesion of the connecting line segment 118 to the conductive line segment 106 or the conductive line segment 108 may be enhanced, thereby improving the reliability of the electronic device, but not limited thereto. The surface roughness may be obtained by measuring the surface of the metal layer by a roughness meter or other suitable instruments, but not limited thereto.

The connecting line segment 118 may have a height H1 (or may be referred to as a first height), and the height H1 may be, for example, the maximum distance between the bottom surface and the surface 118F of the connecting line segment 118 in the direction Z. The conductive line segment 106 may have a height H2 (or may be referred to as a second height), and the height H2 may be, for example, the maximum distance between the bottom surface and the surface 106F of the conductive line segment 106 located on the dielectric layer 130 in the direction Z. The conductive line segment 108 may have a height H3, and the height H3 may be, for example, the maximum distance between the bottom surface and the surface 108F of the conductive line segment 108 located on the dielectric layer 130 in the direction Z. The height H1 may be different from the height H2, or the height H1 may be different from the height H3.

For example, the ratio of the height H1 to the height H2 may be greater than 1 and less than or equal to 2.2, or the ratio of the height H1 to the height H3 may be greater than 1 and less than or equal to 2.2. Since the height H1 of the connecting line segment 118 may be greater than the height H2 of the conductive line segment 106 (or the height H3 of the conductive line segment 108), the connecting line segment 118 may fill the opening between the conductive line segment 106 and the conductive line segment 108, thereby reducing the difference in resistance between the connecting line segment 118 and the conductive line segment 106 (or the conductive line segment 108). Therefore, the electrical performance between the connecting line segment 118 and the conductive line segment 106 (or the conductive line segment 108) may be improved.

The portion P3 and the portion P4 of the connecting line segment 118 may have side surfaces 118S, and the side surfaces 118S may be connected to the surface 118F. An included angle α is disposed between the side surface 118S and the surface 108F of the conductive line segment 108 (or the surface 106F of the conductive line segment 106), and the included angle α may be greater than or equal to 30 degrees and less than 90 degrees. For example, the adhesion between the connecting line segment 118 and the conductive line segment 106 and between the connecting line segment 118 and the conductive line segment 108 may be enhanced, or the risk of the connecting line segment 118 being peeled off may be reduced, thereby improving the reliability of the electronic devices, but not limited thereto.

The portion P3 of the connecting line segment 118 may have a width W4 (or may be referred to as a second width) in the direction Y, and the width W4 may be, for example, the width of a bottom surface of the portion P3 that is in contact with the surface 106F of the conductive line segment 106. The width of the portion P4 that is in contact with the surface 108F of the conductive line segment 108 may be substantially the same as the width of the portion P3 that is in contact with the surface 106F of the conductive line segment 106. The portion P1 of the connecting line segment 118 may have a width W5 (or may be referred to as a first width) in the direction Y, and the width W5 may be, for example, the maximum distance of the portion P1 in the direction Y. Furthermore, the ratio of the width W4 to the width W5 may be greater than 0 and less than or equal to 0.1.

Since the portion P3 may partially cover the surface 106F of the conductive line segment 106 and the portion P4 may partially cover the surface 108F of the conductive line segment 108, the adhesive ability between the connecting line segment 118 and the conductive line segment 106 (or the conductive line segment 108) may be enhanced, thereby improving the electrical performance between the connecting line segment 118 and the conductive line segment 106 (or the conductive line segment 108) or improving the reliability of the electronic device 10.

In addition, the oxygen content of the connecting line segment 118 is different from the oxygen content of the conductive line segment 106 (or the conductive line segment 108), or the carbon content of the connecting line segment 118 is different from the carbon content of the conductive line segment 106 (or the conductive line segment 108). For example, an energy-dispersive X-ray spectroscopy (EDS) may be used for surface analysis, and the oxygen content of the connecting line segment 118 is less than or equal to the oxygen content of the conductive line segment 106 (or the conductive line segment 108), or the carbon content of the connecting line segment 118 is less than or equal to the carbon content of the conductive line segment 106 (or the conductive line segment 108), which may reduce the impedance of the connecting line segment 118. For example, the electrical performance between the connecting line segment 118 and the conductive line segment 106 (or the conductive line segment 108) may be improved, or the reliability of the electronic device 10 may be improved, but not limited thereto. The oxygen content analysis may be obtained through other suitable instruments, but not limited thereto. In addition, other dielectric layers and conductive layers may be formed on the conductive layer 128.

The electronic device and the manufacturing method thereof of the present disclosure are not limited to the above-mentioned embodiments. The following will continue to disclose other embodiments of the present disclosure. However, in order to simplify the description and clearly show the differences between the embodiments, the same reference numerals are used in the following to label the same components, and the repeated portions will not be described.

Figure 4:
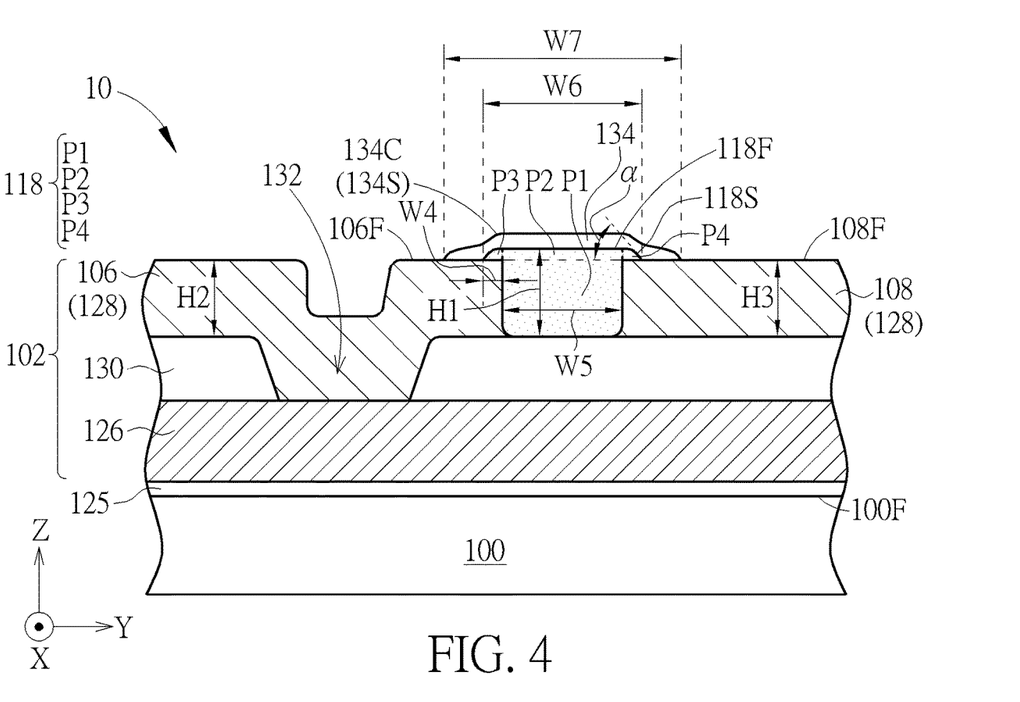
FIG. 4 is a schematic cross-sectional view of an electronic device according to a second embodiment of the present disclosure.

Please refer to FIG. 4, which is a schematic cross-sectional view of an electronic device according to a second embodiment of the present disclosure. In order to clearly show the technical features of the present disclosure and make the drawings easier to understand, FIG. 4 depicts the substrate 100 and two of the conductive layers and one of the dielectric layers in the connecting element 102. However, the number of the dielectric layers or the conductive layers in the connecting element 102 is not limited thereto, and other electronic components may also be disposed on the substrate 100.

The difference between this embodiment and the first embodiment (as shown in FIG. 3) is that a protective layer 134 may also be formed to cover the connecting line segment 118. In addition, the protective layer 134 may also cover a portion of the surface 106F of the conductive line segment 106 or a portion of the surface 108F of the conductive line segment 108. The protective layer 134 of this embodiment may include organic protect ink, but not limited thereto. The material of the protective layer 134 may include organic or inorganic insulating materials, but not limited thereto. The protective layer 134 may have an upper surface 134S, and the upper surface 134S has a curved corner 134C. The design of the curved corner of the protective layer may reduce the cracking of another dielectric layer disposed on the protective layer 134, thereby improving the reliability of the electronic device 10.

As shown in FIG. 4, the connecting line segment 118 may have a width W6 (or may be referred to as a third width) in the direction Y, and the width W6 may be, for example, the maximum width of the portion P2 in the direction Y. The protective layer 134 may have a width W7 (or may be referred to as a fourth width) in the direction Y, and the width W7 may be, for example, the maximum width of the protective layer 134 in the direction Y. In addition, the ratio of the width W7 to the width W6 may be greater than or equal to 1 and less than or equal to 1.3. The protective layer 134 may prevent the connecting line segment 118 from being scratched or corroded by acid and/or alkali materials.

Figure 5:
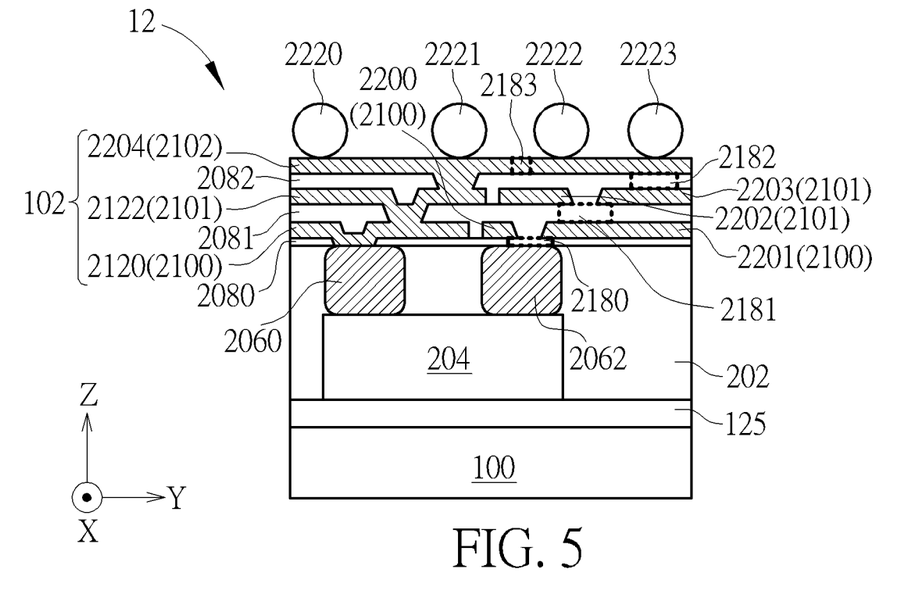
FIG. 5 is a schematic cross-sectional view of an electronic device before repair according to a third embodiment of the present disclosure.
Figure 6:
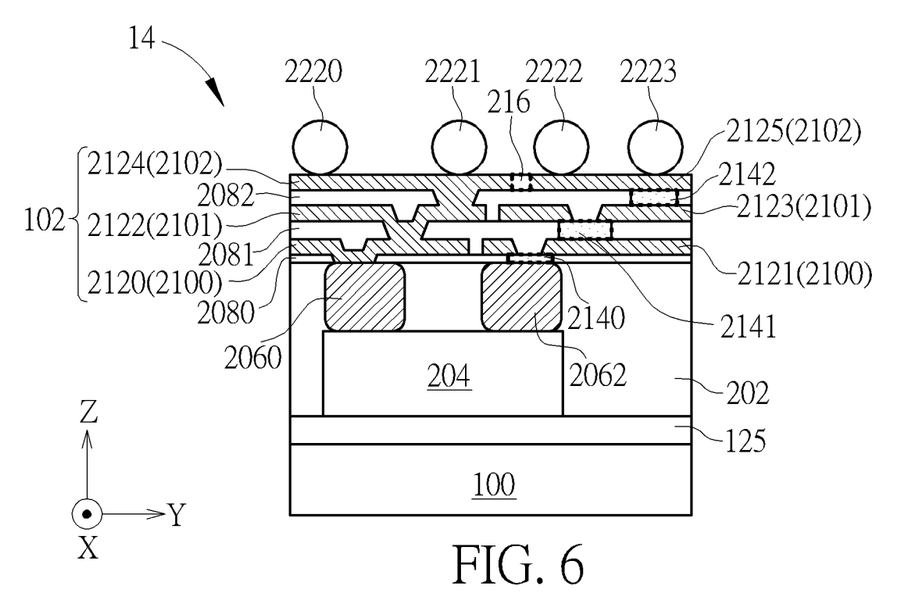
FIG. 6 is a schematic cross-sectional view of the electronic device after repair according to the third embodiment of the present disclosure.

Please refer to FIG. 5 and FIG. 6, FIG. 5 is a schematic cross-sectional view of an electronic device before repair according to a third embodiment of the present disclosure, and FIG. 6 is a cross-sectional view of the electronic device after repair according to the third embodiment of the present disclosure. FIG. 5 and FIG. 6 may be, for example, a chip first structure where a chip is formed first, and then a connecting element is formed. The electronic device 12 of FIG. 5 is an electronic device that has not been repaired, and the electronic device 14 of FIG. 6 is an electronic device that has been repaired.

In this embodiment, the electronic device 12 or the electronic device 14 may include the substrate 100, the release layer 125, an insulating layer 202, a chip 204, a contact pad 2060, a contact pad 2062, and the connecting element 102, but not limited thereto. The insulating layer 202, the chip 204, the contact pad 2060 and the contact pad 2062 may be disposed between the release layer 125 and the connecting element 102. The chip 204, the contact pad 2060 and the contact pad 2062 may be disposed on the release layer 125 and in the insulating layer 202, and the contact pad 2060 and the contact pad 2062 may be disposed on the chip 204. In other embodiments, the connecting element 102 and the contact pad 2060 and the contact pad 2062 may be formed first, and then the chip 204 may be disposed (RDL first structure), but not limited thereto.

For example, the chip 204 may include a known good die (KGD), but not limited thereto. The material of the contact pad 2060 and the contact pad 2062 may include metal or other suitable conductive materials, but not limited thereto. The material of the insulating layer 202 may include a molding material, such as an organic or inorganic insulating molding material, but not limited thereto.

The connecting element 102 of this embodiment may include a dielectric layer 2080, a dielectric layer 2081, a dielectric layer 2082, a conductive layer 2100, a conductive layer 2101, and a conductive layer 2102, but not limited thereto. The dielectric layer 2080 may be disposed on the contact pad 2060, the contact pad 2062, and the insulating layer 202, and the conductive layer 2100 may be disposed on the dielectric layer 2080, or the dielectric layer 2080 may be disposed between the conductive layer 2100 and the insulating layer 202. The conductive layer 2101 may be disposed on the conductive layer 2100, and the dielectric layer 2081 may be disposed between the conductive layer 2101 and the conductive layer 2100. The conductive layer 2102 may be disposed on the conductive layer 2101, and the dielectric layer 2082 may be disposed between the conductive layer 2102 and the conductive layer 2101.

In the electronic device 12 of FIG. 5, the conductive layer 2100 may include a wire 2120, a conductive line segment 2200, and a conductive line segment 2201. The conductive layer 2101 may include a wire 2122, a conductive line segment 2202, and a conductive line segment 2203, and the conductive layer 2102 may include a conductive line segment 2204. The connecting element 102 may include an opening 2180, an opening 2181, an opening 2182, and an opening 2183.

In FIG. 5, the opening 2180 may be located in the dielectric layer 2080, so that the conductive line segment 2200 and the conductive line segment 2201 are not electrically connected to the contact pad 2062. Therefore, after the conductive layer 2100 is formed, the opening 2180 (or may be referred to as a breaking position or an open-circuit position) may be obtained through detection, and a portion of the dielectric layer 2080 in the opening 2180 may be removed by laser to expose the surface of the contact pad 2062. The laser used here may have a different energy from the laser 124 (or the laser 116) in the first embodiment, or may be a different kind of laser from the laser 124 (or the laser 116) in the first embodiment. Then, the step S102 to the step S110 of FIG. 1 may be performed to form a connecting line segment 2140 of FIG. 6, so that a wire 2121 may be electrically connected to the contact pad 2062 through the connecting line segment 2140.

In FIG. 5, the opening 2181 may be located in the dielectric layer 2081, so that the conductive line segment 2202 and the conductive line segment 2203 are not electrically connected to the conductive line segment 2201. Therefore, after the conductive layer 2101 is formed, the opening 2181 (or may be referred to as a breaking position or an open-circuit position) may be obtained through detection, and a portion of the dielectric layer 2081 in the opening 2181 may be removed by laser to expose the surface of the conductive line segment 2201. Then, the step S102 to the step S110 of FIG. 1 may be performed to form a connecting line segment 2141 of FIG. 6, so that a wire 2123 may be electrically connected to the wire 2121 through the connecting line segment 2141.

In FIG. 5, the opening 2182 may be located in the dielectric layer 2082, so that the conductive line segment 2204 are not electrically connected to the conductive line segment 2203. Therefore, after the conductive layer 2102 is formed, the opening 2182 (or may be referred to as an open-circuit position) may be obtained through detection, and a portion of the dielectric layer 2082 in the opening 2182 may be removed and a portion of the conductive layer 2102 on the opening 2182 may be removed by laser to expose the surface of the conductive line segment 2203. Then, the step S102 to the step S110 of FIG. 1 may be performed to form a connecting line segment 2142 of FIG. 6, so that a wire 2125 may be electrically connected to the wire 2123 through the connecting line segment 2142.

In FIG. 5, the opening 2183 may be located in the conductive layer 2102, so that the wire 2125 and a wire 2124 in FIG. 6 are short in circuit. Therefore, in this embodiment, after the conductive layer 2102 is formed, the conductive layer 2102 of the connecting element 102 may be detected to obtain the opening 2183 (or may be referred to as a predetermined notch position or a short-circuit position). In other words, the conductive layer 2102 of the connecting element 102 may include a conductive line segment 2204 (or may be referred to as a third conductive line segment), and a portion of the conductive line segment 2204 is disposed in the opening 2183. Then, a laser may be used to remove the portion of the conductive line segment 2204 to form a notch 216, and the wire 2124 and the wire 2125 of FIG. 6 are formed in the conductive layer 2102, and the wire 2124 and the wire 2125 may be electrically isolated. The laser used here may have a different energy from the laser 124 (or the laser 116) in the first embodiment, or may be a different kind of laser from the laser 124 (or the laser 116) in the first embodiment.

In the electronic device 14 of FIG. 6, the contact pad 2060, the wire 2120, the wire 2122, and the wire 2124 may be electrically connected to each other, and the contact pad 2062, the wire 2121, the wire 2123, and the wire 2125 may be electrically connected to each other. The contact pad 2060, the wire 2120, the wire 2122, and the wire 2124 may be electrically isolated from the contact pad 2062, the wire 2121, the wire 2123, and the wire 2125.

In addition, as shown in FIG. 5, the electronic device 12 includes a bonding pad 2220, a bonding pad 2221, a bonding pad 2222, and a bonding pad 2223. The material of the bonding pads may include metal or other suitable conductive materials, but not limited thereto. The bonding pad 2220, the bonding pad 2221, the bonding pad 2222, and the bonding pad 2223 are all disposed on the conductive line segment 2204, so that these bonding pads are electrically connected to the contact pad 2060, and the bonding pad 2222 and the bonding pad 2223 are not electrically connected to the contact pad 2062.

However, as shown in FIG. 6, through the above-mentioned manufacturing method, the bonding pad 2220 and the bonding pad 2221 may be disposed on the wire 2124, and the bonding pad 2220 and the bonding pad 2221 may be electrically connected to the contact pad 2060 through the wire 2124, the wire 2122, and the wire 2120. In addition, the bonding pad 2222 and the bonding pad 2223 may be disposed on the wire 2125, and the bonding pad 2222 and the bonding pad 2223 may be electrically connected to the contact pad 2062 through the wire 2125, the connecting line segment 2142, the wire 2123, the connecting line segment 2141, the wire 2121, and the connecting line segment 2140.

Figure 7:
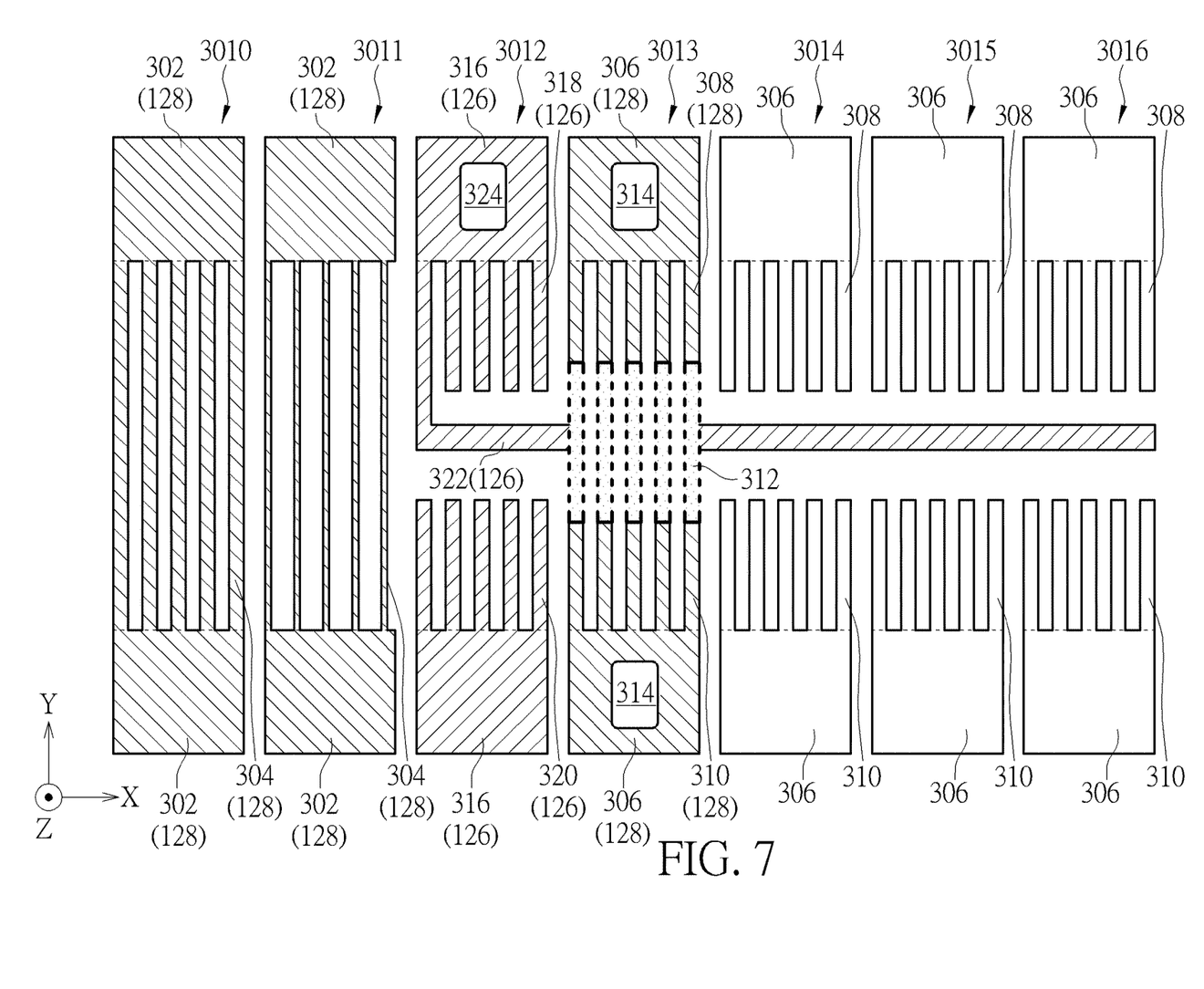
FIG. 7 is a schematic diagram of a test component according to a fourth embodiment of the present disclosure.

Please refer to FIG. 7, which is a schematic diagram of a test component according to a fourth embodiment of the present disclosure. The electronic device 10 (or the electronic device 14) may further include a plurality of test components disposed on the substrate 100. The test components and the structure of FIG. 3, FIG. 4, or FIG. 6 may be disposed in different regions of the substrate 100, and at least some of the test components may be electrically connected to the conductive layer in the connecting element 102 of FIG. 3, FIG. 4, or FIG. 6, but not limited thereto.

As shown in FIG. 7, a test component 3010 to a test component 3016 are taken as an example in this embodiment, but the number of test components is not limited to that shown in FIG. 7. The test components of FIG. 7 may be, for example, a test element group (TEG), but not limited thereto. The test component 3010 or the test component 3011 (or may be referred to as a first test component) may include a plurality of conductive pads 302 (or may be referred to as a first conductive pad) and a plurality of connecting lines 304 (or may be referred to as a first connecting line). The connecting lines 304 may extend along the direction Y, and the conductive pads 302 may be electrically connected to each other through the connecting lines 304.

The line width of the connecting line 304 of the test component 3010 or the test component 3011 may be the same as the line width of the wire in the conductive layer of the connecting element 102, and the line width of the connecting line 304 of the test component 3010 may be different from the line width of the connecting line 304 of the test component 3011. For example, the line width of the connecting line 304 of the test component 3010 may be greater than the line width of the connecting line 304 of the test component 3011, the line width of the connecting line 304 of the test component 3010 may be about 5 micrometers, and the line width of the connecting line 304 of the test component 3011 may be about 2 micrometers, but not limited thereto.

The test component 3013, the test component 3014, the test component 3015, or the test component 3016 may include a plurality of conductive pads 306, a plurality of conductive line segments 308, and a plurality of conductive line segments 310. The conductive line segments 308 and the conductive line segments 310 may extend along the direction Y, and the conductive line segment 308 may be connected to one of the conductive pads 306, the conductive line segment 310 may be connected to another one of the conductive pads 306, and the conductive line segment 308 and the conductive line segment 310 may be separated from each other.

The test component 3013 (or may be referred to as a second test component) may further include a plurality of connecting line segments 312 (or may be referred to as the second connecting line segments) disposed between the conductive line segment 308 and the conductive line segment 310. The connecting line segment 312 may extend along the direction Y, one end of the connecting line segment 312 may be connected to the conductive line segment 308, and another end of the connecting line segment 312 may be connected to the conductive line segment 310. Therefore, the conductive line segment 308 and the conductive line segment 310 may be electrically connected to each other through the connecting line segment 312, so that the two conductive pads 306 (or may be referred to as the second conductive pads) of the test component 3013 may be electrically connected to each other through the connecting line segment 312.

For example, the connecting line segments 312 may be formed by the manufacturing method of the first embodiment (as shown in FIG. 1). In this embodiment, the line widths of the conductive line segment 308 and the conductive line segment 310 may be about 5 micrometers, and the line width of the connecting line segment 312 and the line width of the conductive line segment 308 (or the conductive line segment 310) may be substantially the same, but not limited thereto.

The connecting element 102 of FIG. 3 is taken as an example, the conductive layer 128 (or may be referred to as a first conductive layer) may include the conductive line segment 106 and the conductive line segment 108 of FIG. 3, and may include the conductive pad 302 and the connecting line 304 of the test component 3010 and the test component 3011 and the conductive pad 306 of the test component 3013 of FIG. 7, but not limited thereto. The connecting line segment 118 of FIG. 3 and the connecting line segment 312 of FIG. 7 may be formed by the conductive element 112 after curing in the repair method, but not limited thereto. In addition, the test component 3014, the test component 3015, or the test component 3016 may be formed by the conductive layer 128, or may be formed by other conductive layers (not shown) in the connecting element 102.

For example, the conductive layer 128 may be electroplated copper, and the connecting line segment 118 may be formed of copper-containing metal ink. The oxygen content of the conductive layer 128 may be different from the oxygen content of the connecting line segment 118, or the carbon content of the conductive layer 128 may be different from the carbon content of the connecting line segment 118.

As shown in FIG. 7, the test component 3013 may further include a plurality of probe pin contact pads 314, and each of the probe pin contact pads 314 may be electrically connected to one conductive pad 306. For example, the probe pin contact pad 314 may be formed of the conductive layer 128, and may be a portion of the conductive pad 306, but not limited thereto. When a plurality of dielectric layers and a plurality of conductive layers are further disposed on the conductive layer 128 of FIG. 3, the probe pin contact pads 314 may be selectively formed by the uppermost conductive layer, or may be formed by one of the conductive layers between the uppermost conductive layer and the conductive layer 128, and these conductive layers may be electrically connected to the conductive pads 306. In addition, the test component 3010 or the test component 3011 may also have similar probe pin contact pads.

The manufacturing method of the electronic device of this embodiment may include measuring the resistance of the test component 3010 (or the test component 3011) and the resistance of the test component 3013. For example, the resistance of the connecting lines 304 may be measured through the conductive pads 302, and the resistance of the conductive line segments 308, the connecting line segments 312, and the conductive line segments 310 may be measured through the conductive pads 306 (or the probe pin contact pads 314). Therefore, the resistance of the conductive line segment 106, the connecting line segment 118, and the conductive line segment 108 in the connecting element 102 and the resistance of the wire formed by the conductive layer 128 in the connecting element 102 of FIG. 3 are obtained. Through monitoring the difference in resistance, it may prevent the excessive difference in the resistance of the wires in the repaired electronic device, thereby preventing the electrical performance of the product from degrading.

The test component 3012 (or may be referred to as a third test component) may include a plurality of conductive pads 316 (or may be referred to as the third conductive pads), a plurality of conductive line segments 318 and a plurality of conductive line segments 320. The conductive line segments 318 and the conductive line segments 320 may extend along the direction Y, the conductive line segments 318 may be connected to one of the conductive pads 316, the conductive line segments 320 may be connected to another one of the conductive pads 316, and the conductive line segments 318 and the conductive line segments 320 may be separated from each other.

The test component 3012 may further include an extension line segment 322. One end of the extension line segment 322 may be connected to one of the conductive line segments 318, that is, the extension line segment 322 may be electrically connected to one of the conductive pads 316. The extension line segment 322 may extend along the direction X between the conductive line segments 320 and the remaining conductive line segments 318 of the test component 3012 and between the conductive line segments 308 and the conductive line segments 310 of the test component 3013, the test component 3014, the test component 3015 and the test component 3016. The extension line segment 322 may be separated from the conductive line segments 320 and the remaining conductive line segments 318 of the test component 3012, and the extension line segment 322 may be separated from the conductive line segments 308 and the conductive line segments 310 of the test component 3013, the test component 3014, the test component 3015 and the test component 3016.

In addition, since the extension direction of the extension line segment 322 and the extension direction of the connecting line segment 312 of the test component 3013 are different, the projection of the extension line segment 322 on the surface 100F of the substrate 100 and the projection of the connecting line segments 312 on the surface 100F of the substrate 100 in the direction Z may be partially overlapped or crossed.

The connecting element 102 of FIG. 3 is taken as an example, the conductive layer 126 (or may be referred to as a third conductive layer) may include the conductive pads 316, the conductive line segments 318, the conductive line segments 320, and the extended line segment 322 of the test component 3012 of FIG. 7, but not limited thereto. In addition, as shown in FIG. 3, the dielectric layer 130 may be disposed between the conductive layer 126 and the conductive layer 128 or between the conductive layer 126 and the connecting line segment 118, but not limited thereto. In addition, the conductive layer 126 may also be, for example, electroplated copper, but not limited thereto.

As shown in FIG. 7, the test component 3012 may further include a probe pin contact pad 324. The probe pin contact pad 324 may be electrically connected to one of the conductive pads 316 and may be electrically connected to the extension line segment 322. For example, the probe pin contact pad 324 may be formed of the conductive layer 126 and may be a portion of the conductive pad 316, but not limited thereto. When a plurality of dielectric layers and a plurality of conductive layers are further disposed on the conductive layer 126 of FIG. 3, the probe pin contact pad 324 may be selectively formed by the uppermost conductive layer, or may be formed by one of the conductive layers between the uppermost conductive layer and the conductive layer 126, and these conductive layers may be electrically connected to the conductive pad 316.

The manufacturing method of the electronic device of the embodiment of the present disclosure may include performing a conductivity test on the test component 3013 and the test component 3012. For example, the probe pin contact pad 324 and the probe pin contact pad 314 may be used to measure whether the test component 3013 and the test component 3012 are electrically conductive (i.e., short-circuit). Since the test component 3013 and the test component 3012 are formed of different conductive layers, and there is a dielectric layer (such as the dielectric layer 130 of FIG. 3) between the conductive layers, through the conductivity test between the test component 3013 and the test component 3012 will know whether the dielectric layer in the connecting element 102 is damaged by the laser used in the manufacturing method.

For example, when the test component 3013 and the test component 3012 are electrically conductive, it can be determined that the dielectric layer has been damaged by the laser, or the electronic device can be determined to be a defective product, and the laser intensity should be adjusted, thereby improving the yield of the products. In addition, values of the electrical characteristics in the above-mentioned resistance measurement or conductivity test may be measured by a four-point probe measurement system, but not limited thereto.

In summary, in the electronic devices and the manufacturing methods thereof of the present disclosure, the problem of open-circuit in the connecting element may be overcome by thermal curing the conductive element, or the short-circuit problem in the connecting element may be overcome by using laser to remove the excess conductive material, thereby improving the yield of the products. In addition, values of the electrical characteristics the test components may be monitored to determine whether the repaired electronic device meets the product specifications, thereby improving the yield of the products.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a connecting element comprising:
      a first conductive line segment;
      a second conductive line segment; and
      a first connecting line segment, wherein the first conductive line segment is electrically connected to the second conductive line segment through the first connecting line segment,
      wherein in a vertical projection direction, the first connecting line segment has a first height, the first conductive line segment has a second height, and the first height is different from the second height,
      wherein in a top view of the electronic device, the first conductive line segment and the first connecting line segment extends along a first direction, a connection portion of the first connecting line segment connecting to the first conductive line segment has an arc-shaped edge, a line width of the first connecting line segment in a second direction is larger than a line width of the first conductive line segment in the second direction, and the second direction is perpendicular to the first direction.

2. The electronic device according to claim 1, wherein a ratio of the first height to the second height is greater than 1 and less than or equal to 2.2.

3. The electronic device according to claim 1, wherein a surface roughness of the first connecting line segment is different from a surface roughness of the first conductive line segment or the second conductive line segment.

4. The electronic device according to claim 1, wherein a portion of the first connecting line segment covers a surface of the first conductive line segment, the portion of the first connecting line segment has a side surface, an included angle is disposed between the side surface and the surface of the first conductive line segment, and the included angle is greater than or equal to 30 degrees and less than 90 degrees.

5. The electronic device according to claim 1, wherein the first connecting line segment comprises:
   a first portion, disposed between the first conductive line segment and the second conductive line segment, wherein the first portion has a first width;
   a second portion, disposed on the first portion;
   a third portion, partially covering a surface of the first conductive line segment; and
   a fourth portion, partially covering a surface of the second conductive line segment,
   wherein the second portion is disposed between the third portion and the fourth portion, the third portion has a second width, and a ratio of the second width to the first width is greater than 0 and less than or equal to 0.1.

6. The electronic device according to claim 1, further comprising a protective layer covering the first connecting line segment.

7. The electronic device according to claim 6, wherein the protective layer has an upper surface, and the upper surface has a curved corner.

8. The electronic device according to claim 6, wherein a portion of the first connecting line segment is higher than the first conductive line segment and the second conductive line segment, the portion of the first connecting line segment has a third width, the protective layer has a fourth width, and a ratio of the fourth width to the third width is greater than or equal to 1 and less than or equal to 1.3.

9. The electronic device according to claim 1, wherein an oxygen content of the first connecting line segment is different from an oxygen content of the first conductive line segment or the second conductive line segment.

10. The electronic device according to claim 1, wherein a carbon content of the first connecting line segment is different from a carbon content of the first conductive line segment or the second conductive line segment.

* * * * *